(12) United States Patent
Allen et al.

(10) Patent No.: US 6,504,212 B1
(45) Date of Patent: Jan. 7, 2003

(54) METHOD AND APPARATUS FOR ENHANCED SOI PASSGATE OPERATIONS

(75) Inventors: David Howard Allen, Rochester, MN (US); Jente Benedict Kuang, Lakeville, MN (US); Pong-Fei Lu, Yorktown Heights, NY (US); Mary Joseph Saccamango, Poughquag, NY (US); Daniel Lawrence Stasiak, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/497,361

(22) Filed: Feb. 3, 2000

(51) Int. Cl.$^7$ ................................................ H01L 27/01
(52) U.S. Cl. ...................... 257/347; 257/348; 257/351; 257/355; 257/356; 257/547
(58) Field of Search ................................ 257/347, 348, 257/351, 355, 356, 547

(56) References Cited

U.S. PATENT DOCUMENTS

| 6,127,892 A | * 10/2000 | Komuraskai et al. | ....... 330/277 |
| 6,281,737 B1 | * 8/2001 | Kuang et al. | ............... 327/382 |
| 6,300,649 B1 | * 10/2001 | Hu et al. | ...................... 257/69 |
| 6,304,123 B1 | * 10/2001 | Bosshart | ..................... 327/212 |

OTHER PUBLICATIONS

Method and Apparatus for Reducing Parasitic Bipolar Current in a Silicon–on–Insulator Transistor (Case AT998–550) by Jente B. Kuang et al. U.S. patent application Ser. No. 09/196,907 filed Nov. 20, 1998.

* cited by examiner

Primary Examiner—Eddie Lee
Assistant Examiner—Matthew E. Warren
(74) Attorney, Agent, or Firm—Joan Pennington

(57) ABSTRACT

A method and apparatus are provided for implementing enhanced silicon-on-insulator (SOI) passgate operations. The apparatus for implementing enhanced silicon-on-insulator (SOI) passgate operations includes a silicon-on-insulator (SOI) passgate field effect transistor. A select input is coupled to the silicon-on-insulator (SOI) passgate field effect transistor. A discharging field effect transistor of an opposite channel type is coupled to the silicon-on-insulator (SOI) passgate field effect transistor. The discharging field effect transistor is activated during an off cycle of the silicon-on-insulator (SOI) passgate field effect transistor. The discharging field effect transistor is coupled to the body of the SOI passgate field effect transistor. The discharging field effect transistor is deactivated during an on cycle of the SOI passgate field effect transistor, whereby the body of the SOI passgate field effect transistor floats during the on cycle. The method for implementing enhanced silicon-on-insulator (SOI) passgate operations can be used with N-channel or P-channel implementations as well as with a combination of N-channel and P-channel devices.

16 Claims, 9 Drawing Sheets

METHOD AND APPARATUS FOR ENHANCED SOI PASSGATE OPERATIONS

FIELD OF THE INVENTION

The present invention relates generally to a method and apparatus for implementing enhanced silicon-on-insulator (SOI) passgate operations.

DESCRIPTION OF THE RELATED ART

Silicon-on-insulator (SOI) technology is an enhanced silicon technology currently being utilized to increase the performance of digital logic circuits. By utilizing SOI technology, designers can increase the speed of digital logic integrated circuits or can reduce their overall power consumption. These advances in technology will lead to the development of more complex and faster computer integrated circuits that operate with less power.

As shown in FIG. 1, SOI semiconductors include a thin layer of silicon placed on top of an insulator, such as silicon dioxide ($SiO_2$) or glass, and a MOS transistor built on top of this structure. The main advantage of constructing the MOS transistor on top of an insulator layer is to reduce the internal capacitance of the transistor. This is accomplished by placing the insulator oxide layer between the silicon substrate and the impurities required for the device to operate as a transistor. Reducing the internal capacitance of the transistor increases its operating speed. With SOI technology, faster MOS transistors can be manufactured resulting in faster electronic devices.

A problem called bipolar discharge exists with SOI FETs. An inherent drawback of placing a MOS transistor on top of a SOI layer is that the MOS transistor is actually placed in parallel with a parasitic bipolar junction transistor, as illustrated in FIG. 2. The parasitic bipolar transistor can cause the unwanted parasitic bipolar current, which alters the speed and lowers noise margin in a dynamic CMOS circuit.

Normally, parasitic bipolar action does not manifest itself in conventional bulk CMOS transistors because the base of the bipolar transistor is always kept at ground potential, keeping the bipolar transistor turned off. In the SOI FET, the body (B) of the MOS FET device, or base of the bipolar transistor, is floating and can be charged high by junction leakages induced when both drain (D) and source (S) terminals of the MOS FET are at a high potential. Subsequently, if the source (S) is pulled to a low potential, the trapped charge in the body (B) is available as base current for the parasitic bipolar transistor. The parasitic base current activates the bipolar transistor and generates a collector current at the drain terminal of the MOS FET. This collector current flow in the bipolar junction transistor or bipolar discharge is undesirable since it causes an unintended loss of charge on the drain node of a dynamic circuit. Such parasitic bipolar current reduces the noise margin of the dynamic circuit and can result in the functional failure.

SOI passgate transistors suffer initial cycle parasitic bipolar current, which causes serious noise, timing and performance concerns. The adverse effects are most severe when the circuit is initially turned on after being idle for a long period of time, for example, for a time scale in the range of milliseconds. This is because the floating body of the SOI field effect transistor can develop a body charge over time. The amount of such body charge will depend on the potentials at the source, drain, and gate terminal electrodes of the SOI field effect transistor. The maximum amount of charging occurs when the gate is completely turned off and both the source and drain electrodes are biased at the highest voltage supply Vdd.

A need exists for an improved method and apparatus for implementing enhanced silicon-on-insulator (SOI) passgate operations.

SUMMARY OF THE INVENTION

A principal object of the present invention is to provide a method and apparatus for implementing enhanced silicon-on-insulator (SOI) passgate operations. Other important objects of the present invention are to provide such method and apparatus for implementing enhanced silicon-on-insulator (SOI) passgate operations substantially without negative effect and that overcome many of the disadvantages of prior art arrangements.

In brief, a method and apparatus are provided for implementing enhanced silicon-on-insulator (SOI) passgate operations. The apparatus for implementing enhanced silicon-on-insulator (SOI) passgate operations includes a silicon-on-insulator (SOI) passgate field effect transistor. A select input is coupled to the silicon-on-insulator (SOI) passgate field effect transistor. A discharging field effect transistor of the opposite channel type is coupled to the silicon-on-insulator (SOI) passgate field effect transistor. The discharging field effect transistor is activated during an off cycle of the silicon-on-insulator (SOI) passgate field effect transistor.

In accordance with features of the invention, the discharging field effect transistor is coupled to the body of the SOI passgate field effect transistor. The discharging field effect transistor is deactivated during an on cycle of the SOI passgate field effect transistor, whereby the body of the SOI passgate field effect transistor floats during the on cycle with a higher-than-ground starting body potential, which enables the low threshold operation from the beginning of the on cycle.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
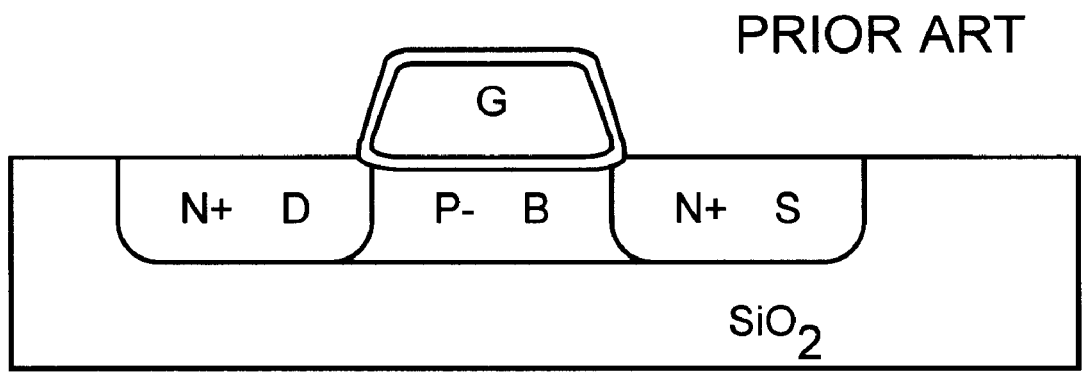
FIG. 1 is a cross sectional view illustrating a conventional silicon-on-insulator (SOI) N-channel field effect transistor (NFET)
Figure 2:
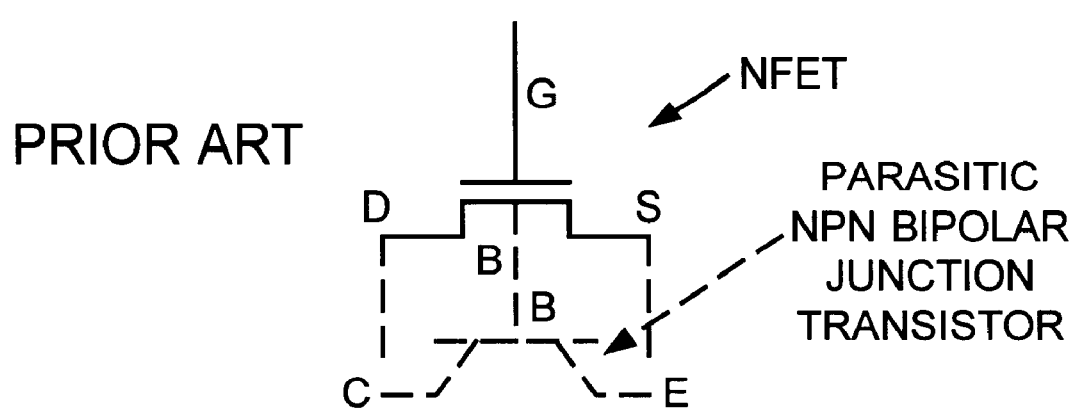
FIG. 2 is a schematic diagram illustrating the conventional silicon-on-insulator (SOI) N-channel field effect transistor (NFET) of FIG. 1 including a parasitic bipolar junction transistor.
Figure 3:
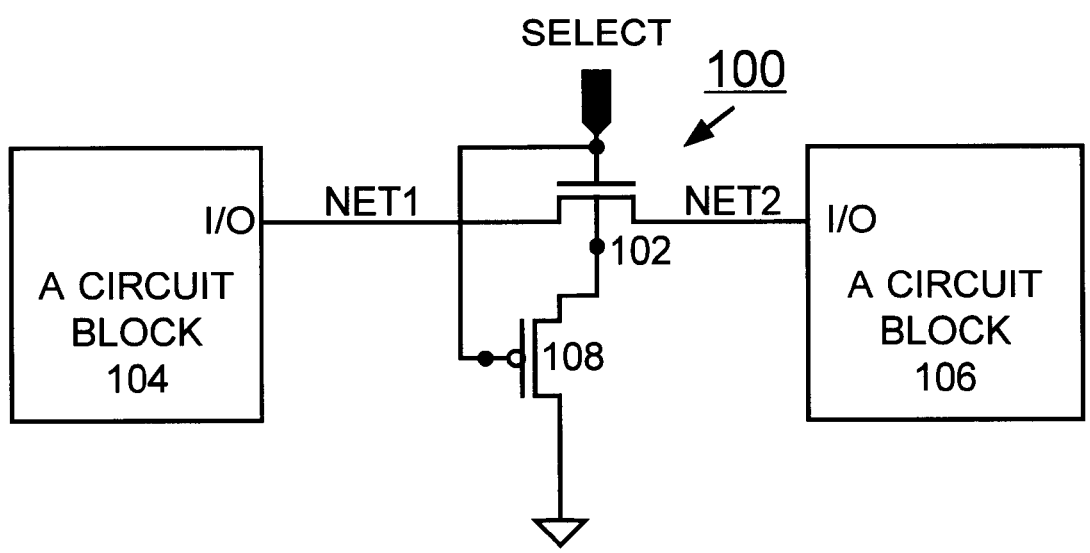
FIG. 3 is a schematic diagram illustrating an SOI n-channel passgate circuit of the preferred embodiment.

Having reference now to the drawings, in FIG. 3, there is shown a silicon-on-insulator (SOI) passgate circuit of the preferred embodiment generally designated by the reference character 100. In accordance with features of the invention, conventional first-cycle parasitic bipolar effect is eliminated while allowing passgate devices to retain their floating body nature when the passgate devices are turned on.

As shown in FIG. 3, SOI passgate circuit 100 includes an N-channel field effect transistor (NFET) 102 having its source connected to a node net1 and its drain connected to a node net2. A select input is connected to the gate of NFET 102. A circuit block 104 and a circuit block 106 are other circuit elements respectively connected to net1 and net2. NFET 102 is a passgate device. A small P-channel field effect transistor (PFET) 108 has its source connected to the body of CMOS NFET 102 and its drain connected to ground. The gate of PFET 108 is connected to the gate of NFET 102 and the select input.

The discharge PFET 108 can be made minimum sized to retain an area advantage since discharge during the off cycle, dealing with much longer time constant than those of circuit switching, is not timing critical. SOI passgate circuit 100 will work even when the body contact is non-ideal or non-efficient because the initial body potential of NFET 102 is kept significantly lower than the threshold of emitter-base (E-B) junction turn-on.

The body of passgate NFET 102 is effectively brought to a low potential through PFET 108 during the off cycle to prevent body charge-up over time, and therefore, prevented from suffering initial cycle parasitic bipolar leakage current. The body of passgate NFET 102 is allowed to float during the on cycle to retain the performance benefit from a lowered threshold voltage in the SOI NFET 102.

In brief, a clear advantage of the discharge method of the preferred embodiment is that, while the parasitic bipolar leakage current is completely suppressed, the nature of the lowered threshold voltage is still preserved as a result of the floating body when the passgate NFET 102 is active. In addition, the residue passgate body charge as a result of using a PFET discharging device provides an even lower starting threshold voltage as compared to using a discharging NFET for the N-channel passgate. There are no restrictions on the circuit configurations of both circuit block 104 and circuit block 106 attached to the source and drain of the passgate NFET 102. The current flow in the passgate NFET 102 can be in either direction; from source to drain or from drain to source. It should be understood that there is no restriction on the usage of the discharge method of the preferred embodiment in conjunction with the topology of passgate NFET 102. For example, passgate NFET 102 can be one leg of a NOR structure, one branch of a multiplexer device, or a shorting device that connects pins of both circuit blocks 104 and 106.

Figure 4:
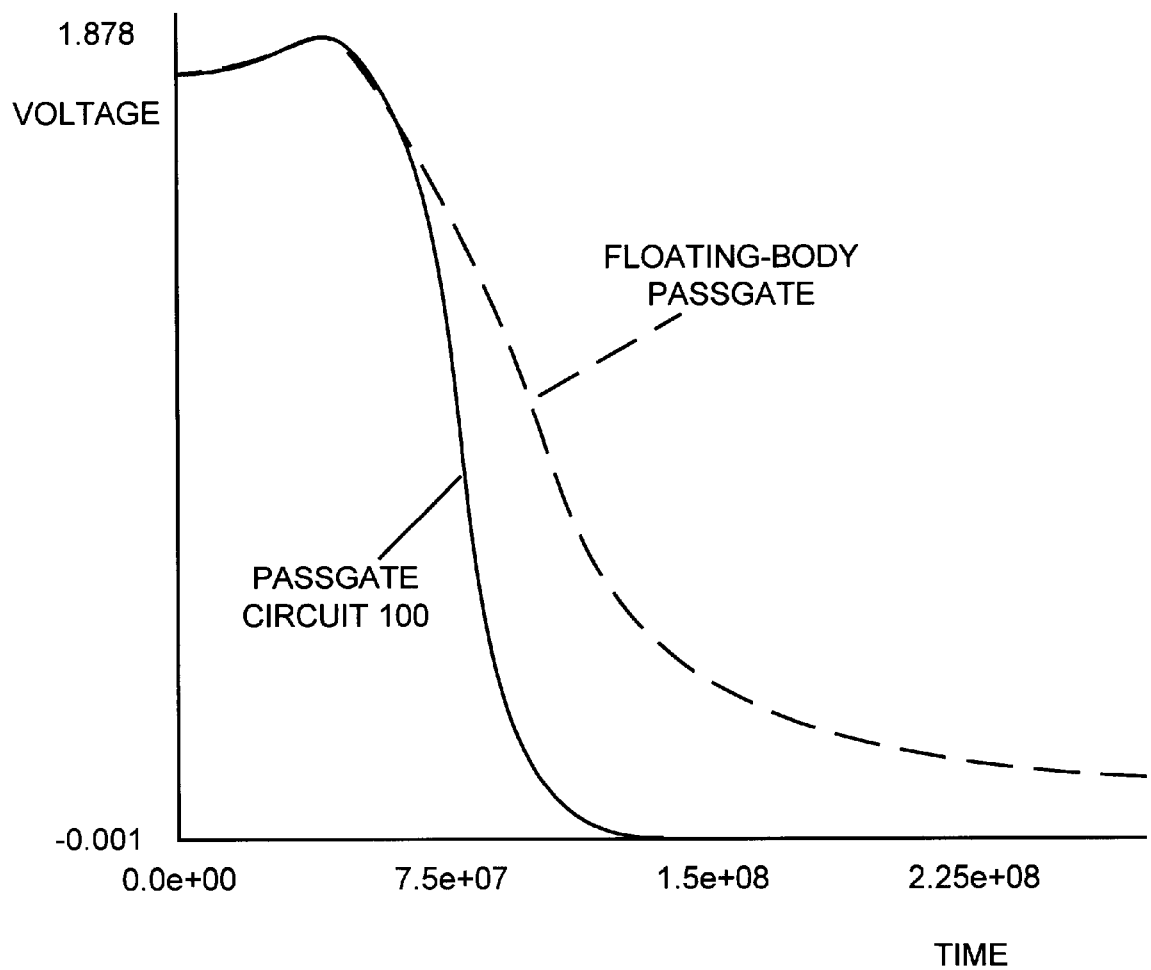
FIG. 4 is a chart illustrating initial cycle voltage transition observed at net1 when the passgate transistor of the SOI passgate circuit is off in accordance with the preferred embodiment as compared to an original, unmodified floating body passgate arrangement.

FIG. 4 is a chart illustrating initial cycle voltage transition observed at net1 when the passgate NFET 102 of the SOI passgate circuit 100 is off in accordance with the preferred embodiment as compared to an original, unmodified floating body passgate arrangement. Net1 is driven low from an internal circuit switching. Both net1 and net2 are at Vdd initially, thereby assuming a maximum parasitic bipolar leakage condition. Note that SOI passgate circuit 100 of the preferred embodiment demonstrates a faster voltage transition due to the absence of parasitic bipolar leakage current.

Figure 5:
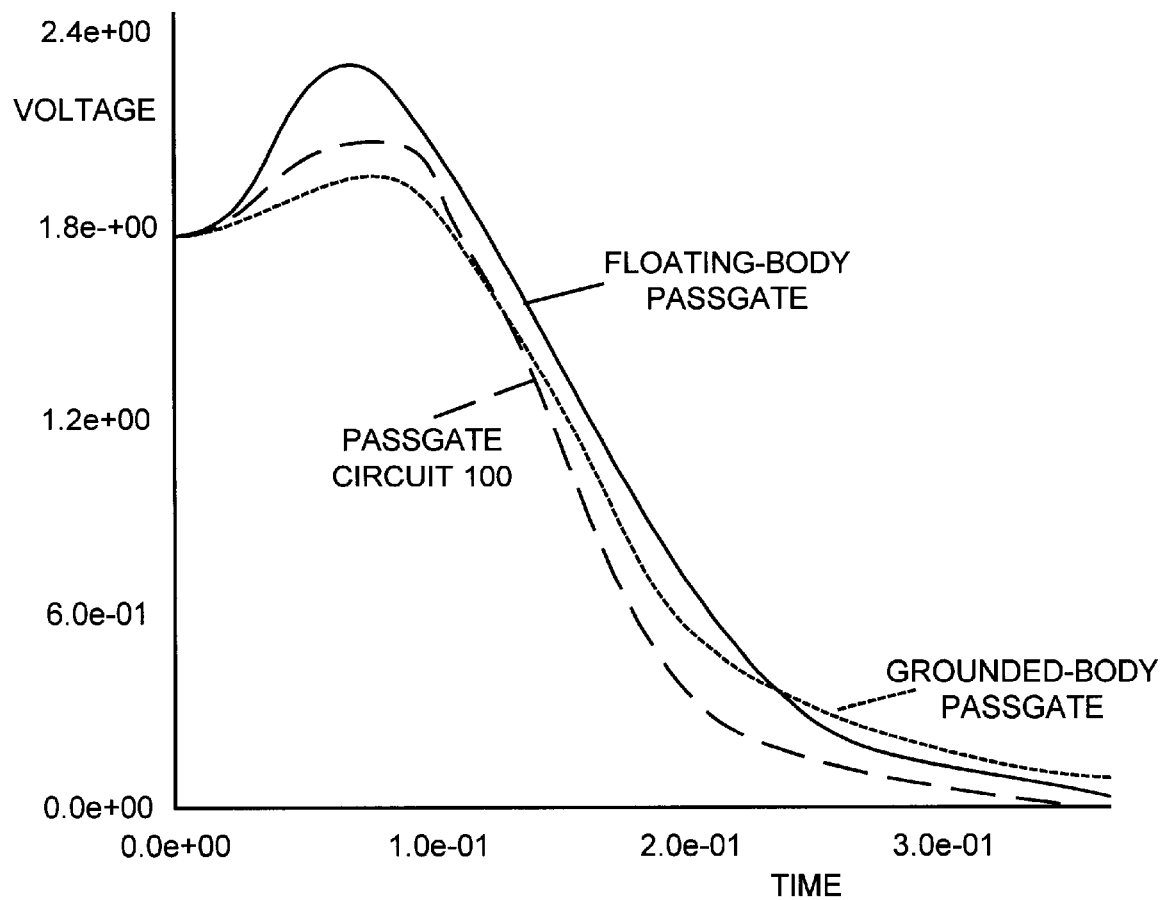
FIG. 5 is a chart illustrating initial cycle voltage transition observed at output of the passgate when the passgate transistor of the SOI passgate circuit is on in accordance with the preferred embodiment as compared to an original, unmodified floating body passgate arrangement and a grounded body passgate arrangement.

FIG. 5 is a chart illustrating output waveforms when signals are driven through the passgate NFET during an initial cycle voltage transition observed at output of the passgate NFET 102 when the passgate NFET 102 of the SOI passgate circuit 100 is on in accordance with the preferred embodiment as compared to an original, unmodified floating body passgate arrangement and a grounded body passgate arrangement. SOI passgate circuit 100 results in a faster first-cycle transition due to the combination of the low on cycle threshold voltage Vt and absence of excessive parasitic bipolar current. The noisy voltage overshoot for SOI passgate circuit 100 of the preferred embodiment is also less severe than in an original, unmodified floating body passgate operation.

Figure 6:
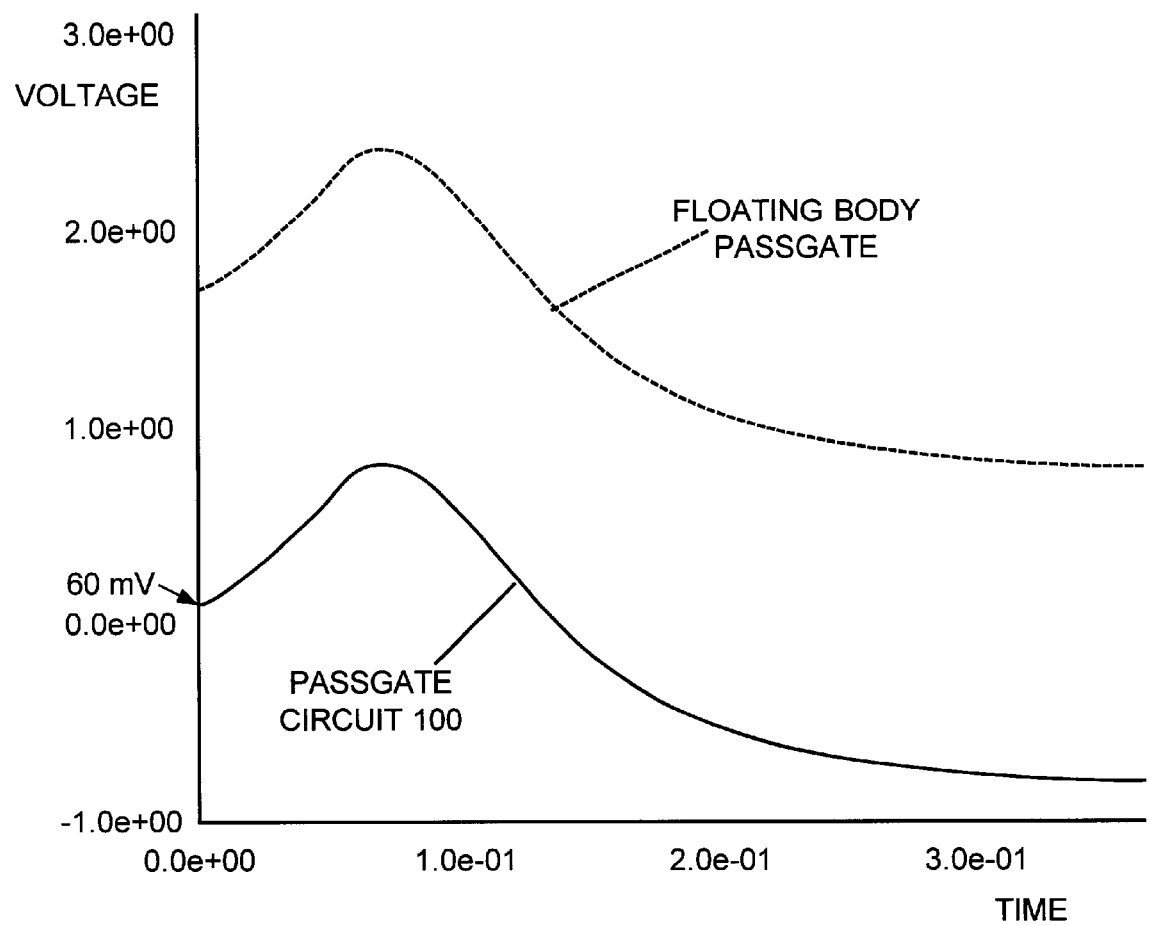
FIG. 6 is a chart illustrating an initial cycle body voltage versus time when the passgate is on of the SOI passgate circuit in accordance with the preferred embodiment as compared to an original, unmodified floating body passgate arrangement.

FIG. 6 is a chart illustrating an initial cycle body voltage versus time when the passgate of the SOI passgate circuit 100 is on in accordance with the preferred embodiment as compared to an original, unmodified floating body passgate arrangement. Note the starting residue passgate body voltage is 60 mV to maintain an even lower Vt as compared to a 0 V starting passgate body voltage if an NFET discharge device is used or if the passgate body is coupled to ground potential.

Figure 7:
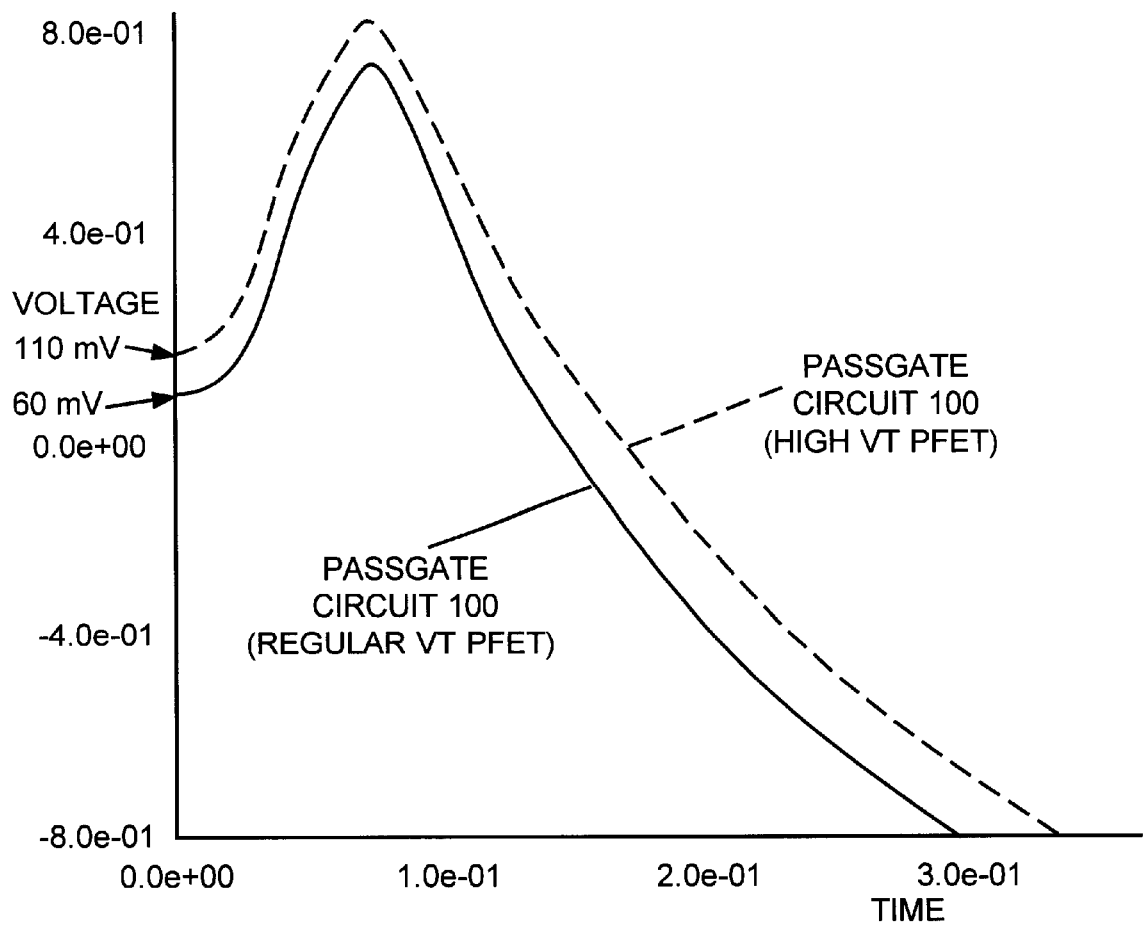
FIG. 7 is a chart illustrating passgate body voltage trajectories for a regular and high Vt discharging PFET implementation of the SOI passgate circuit in accordance with the preferred embodiment.

FIG. 7 is a chart illustrating passgate body voltage trajectories for a regular and high Vt discharging PFET implementations of the SOI passgate circuit 100 in accordance with the preferred embodiment. In advanced multiple Vt VLSI technologies, high Vt devices are available to provide leakage control for paths to Vdd and ground rails. When high Vt discharging PFET is provided, it can conveniently be used to further boost the passgate body voltage, thus enhance the speed. The starting body voltage for the implementation using regular Vt discharging PFET 108 is 60 mV. The starting body voltage for the implementation using high Vt discharging PFET 108 is 110 mV.

Figure 8:
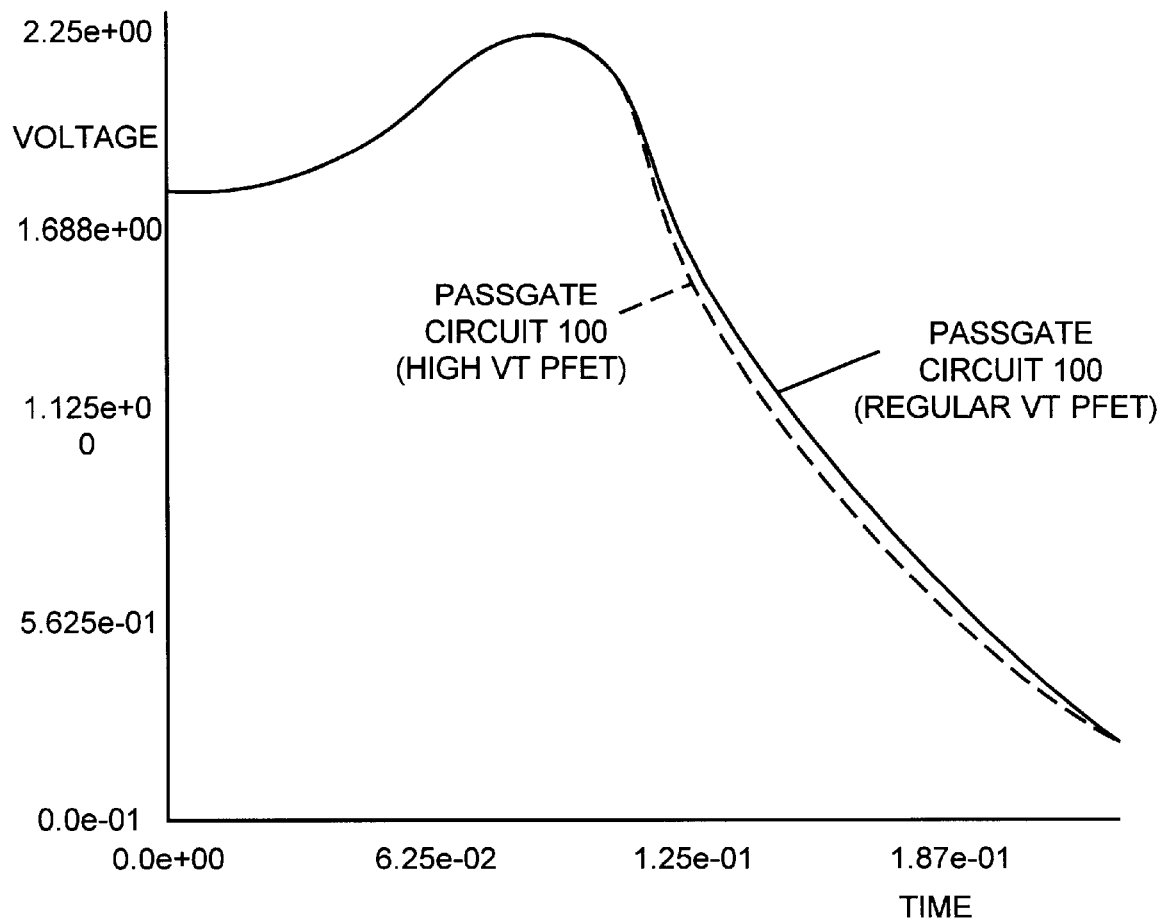
FIG. 8 is a chart illustrating initial cycle output voltage waveforms for a regular and high Vt discharging PFET implementation of the SOI passgate circuit in accordance with the preferred embodiment.

FIG. 8 is a chart illustrating initial cycle output voltage waveforms for a regular and high Vt discharging PFET implementation of the SOI passgate circuit 100 in accordance with the preferred embodiment. The high Vt discharging PFET implementation demonstrates a faster voltage transition due to the lower Vt as a result of the higher starting body voltage.

Figure 9:
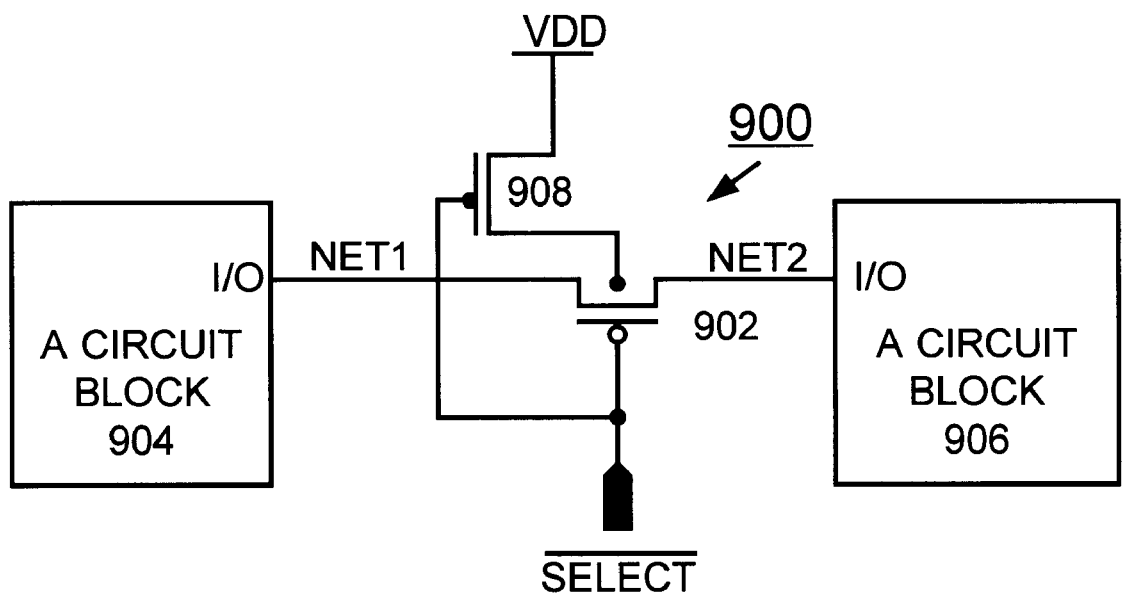
FIG. 9 is a schematic diagram illustrating an SOI p-channel passgate circuit of the preferred embodiment.

FIG. 9 illustrates an SOI p-channel passgate circuit of the preferred embodiment generally designated by the reference character 900. SOI p-channel passgate circuit 900 includes a P-channel field effect transistor (PFET) 902 having its source connected to a node net1 and its drain connected to a node net2. An inverted select input is connected to the gate of PFET 902. A circuit block 904 and a circuit block 906 are other circuit elements respectively connected to net1 and net2. PFET 902 is a passgate device. A small N-channel field effect transistor (NFET) 908 has its source connected to a voltage supply VDD and its drain connected to the body of CMOS PFET 902. The gate of NFET 908 is connected to the gate of PFET 902 and the inverted select input.

For fabrication technologies sensitive to parasitic PNP bipolar currents, the SOI p-channel passgate circuit 900 of FIG. 9 can be employed when the p-channel passgate implementation is preferred.

Figure 10:
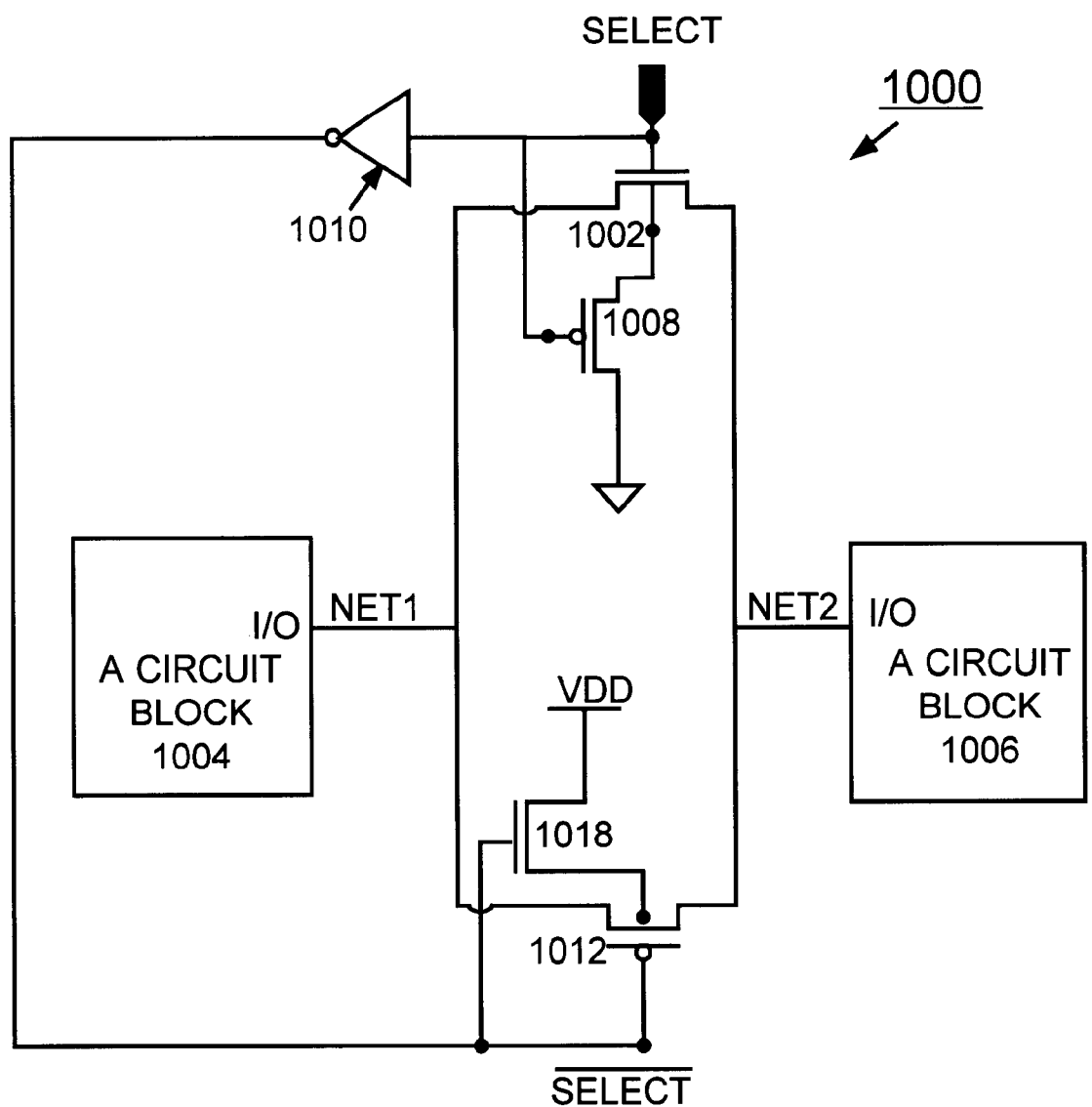
FIG. 10 is a schematic diagram illustrating an SOI full transmission gate circuit of the preferred embodiment.

FIG. 10 illustrates an SOI full transmission gate circuit of the preferred embodiment generally designated by the reference character 1000. SOI full transmission gate circuit 1000 can be utilized when a full transmission gate circuit topology is needed. SOI full transmission gate circuit 1000 includes an N-channel field effect transistor (NFET) 1002 having its source connected to a node net1 and its drain connected to a node net2. A select input is connected to the gate of NFET 1002. A circuit block 1004 and a circuit block 1006 are other circuit elements respectively connected to net1 and net2. NFET 1002 is a passgate device. A small P-channel field effect transistor (PFET) 1008 has its source connected to the body of CMOS NFET 1002 and its drain connected to ground. The gate of PFET 1008 is connected to the gate of NFET 1002 and the select input. SOI full transmission gate circuit 1000 includes an inverter 1010 providing an inverted select input. SOI full transmission gate circuit 1000 includes a P-channel field effect transistor (PFET) 1012 having its source connected to a node net1 and its drain connected to a node net2. The inverted select input is connected to the gate of PFET 1012. PFET 1012 is a passgate device. A small N-channel field effect transistor (NFET) 1018 has its source connected to a voltage supply VDD and its drain connected to the body of CMOS PFET 1012. The gate of NFET 1018 is connected to the gate of PFET 1012 and the inverted select input.

While the present invention has been described with reference to the details of the embodiments of the invention shown in the drawing, these details are not intended to limit the scope of the invention as claimed in the appended claims.

What is claimed is:

1. Apparatus for implementing enhanced silicon-on-insulator (SOI) passgate operations comprising:
    a silicon-on-insulator (SOI) passgate field effect transistor;
    a select input coupled to said silicon-on-insulator (SOI) passgate field effect transistor; and
    a discharging field effect transistor of an opposite channel type coupled to said silicon-on-insulator (SOI) passgate field effect transistor; said discharging field effect transistor being activated only during an off cycle of said silicon-on-insulator (SOI) passgate field effect transistor.

2. Apparatus for implementing enhanced silicon-on-insulator (SOI) passgate operations as recited in claim 1 wherein said discharging field effect transistor is coupled to a body of said silicon-on-insulator (SOI) passgate field effect transistor.

3. Apparatus for implementing enhanced silicon-on-insulator (SOI) passgate operations as recited in claim 2 wherein said discharging field effect transistor is deactivated during an on cycle of said silicon-on-insulator (SOI) passgate field effect transistor, whereby said body of said silicon-on-insulator (SOI) passgate field effect transistor floats during said on cycle.

4. Apparatus for implementing enhanced silicon-on-insulator (SOI) passgate operations as recited in claim 1 wherein said silicon-on-insulator (SOI) passgate field effect transistor is a SOI N-channel field effect transistor (NFET).

5. Apparatus for implementing enhanced silicon-on-insulator (SOI) passgate operations as recited in claim 4 wherein said select input coupled to a gate input of said silicon-on-insulator (SOI) passgate NFET.

6. Apparatus for implementing enhanced silicon-on-insulator (SOI) passgate operations as recited in claim 5 wherein said discharging field effect transistor is a silicon-on-insulator (SOI) P-channel field effect transistor (PFET).

7. Apparatus for implementing enhanced silicon-on-insulator (SOI) passgate operations as recited in claim 6 wherein said select input coupled to a gate input of said discharging silicon-on-insulator (SOI) PFET.

8. Apparatus for implementing enhanced silicon-on-insulator (SOI) passgate operations as recited in claim 7 wherein said discharging silicon-on insulator (SOI) PFET has a source connected to a body of said silicon-on-insulator (SOI) passgate NFET and has a drain connected to ground.

9. Apparatus for implementing enhanced silicon-on-insulator (SOI) passgate operations as recited in claim 1 wherein said silicon-on-insulator (SOI) passgate field effect transistor is a SOI P-channel field effect transistor (PFET).

10. Apparatus for implementing enhanced silicon-on-insulator (SOI) passgate operations as recited in claim 9 wherein said select input is an inverted select input coupled to a gate input of said silicon-on-insulator (SOI) passgate PFET.

11. Apparatus for implementing enhanced silicon-on-insulator (SOI) passgate operations as recited in claim 10 wherein said discharging field effect transistor is a silicon-on-insulator (SOI) N-channel field effect transistor (NFET).

12. Apparatus for implementing enhanced silicon-on-insulator (SOI) passgate operations as recited in claim 11 wherein said inverted select input coupled to a gate input of said discharging silicon-on-insulator (SOI) NFET.

13. Apparatus for implementing enhanced silicon-on-insulator (SOI) passgate operations as recited in claim 12 wherein said discharging silicon-on insulator (SOI) NFET has a source connected to a supply voltage and has a drain connected to body of said silicon-on-insulator (SOI) passgate PFET.

14. Apparatus for implementing enhanced silicon-on-insulator (SOI) passgate operations as recited in claim 12 wherein said silicon-on-insulator (SOI) passgate transistor includes a SOI N-channel field effect transistor (NFET) and a SOI P-channel field effect transistor (PFET).

15. Apparatus for implementing enhanced silicon-on-insulator (SOI) passgate operations as recited in claim 14 wherein said discharging field effect transistor includes a PFET connected between a body of said silicon-on-insulator (SOI) passgate NFET and ground; and an NFET connected between a supply voltage and a body of said silicon-on-insulator (SOI) passgate PFET.

16. Apparatus for implementing enhanced silicon-on-insulator (SOI) passgate operations comprising:
    a silicon-on-insulator (SOI) passgate N-channel field effect transistor (NFET);
    a select input coupled to a gate of said silicon-on-insulator (SOI) passgate NFET; and
    a discharging P-channel field effect transistor (PFET) coupled to a body of said silicon-on-insulator (SOI) passgate NFET; said select input coupled to a gate of said discharging PFET for activating said discharging PFET during an off cycle of said silicon-on-insulator (SOI) passgate NFET.

* * * * *